United States Patent
Dubreuil et al.

(10) Patent No.: US 7,519,092 B2
(45) Date of Patent: Apr. 14, 2009

(54) TUNABLE LASER SOURCE WITH OPTICAL WAVELENGTH ADDRESSING

(75) Inventors: Nicolas Dubreuil, Les Ulis (FR); Gilles Pauliat, Les Ulis (FR); Gérald Roosen, Le Celle les Bordes (FR)

(73) Assignees: Centre National de la Recherche Scientifique - CNRS (FR); Universite Paris-SUD (FR)

( * ) Notice: Subject to any disclaimer, the term of this patent is extended or adjusted under 35 U.S.C. 154(b) by 0 days.

(21) Appl. No.: 11/578,715

(22) PCT Filed: Apr. 14, 2005

(86) PCT No.: PCT/FR2005/000906

§ 371 (c)(1),
(2), (4) Date: Nov. 8, 2006

(87) PCT Pub. No.: WO2005/104310

PCT Pub. Date: Nov. 3, 2005

(65) Prior Publication Data

US 2007/0242706 A1  Oct. 18, 2007

(30) Foreign Application Priority Data

Apr. 14, 2004  (FR) .................... 04 03890

(51) Int. Cl.
*H01S 3/098* (2006.01)
(52) U.S. Cl. .............................. 372/18; 372/19; 372/32; 372/68
(58) Field of Classification Search .................. 372/19, 372/32, 18, 68
See application file for complete search history.

(56) References Cited

U.S. PATENT DOCUMENTS 4,635,246 A * 1/1987 Taylor et al. ................. 398/79
5,097,478 A   3/1992 Verdiell et al.

FOREIGN PATENT DOCUMENTS

| EP | 0 375 021 A1 | 6/1990 |
| EP | 0 829 935 A2 | 3/1998 |
| EP | 0 829 935 A3 | 3/1998 |
| EP | 1 125 347 | 8/2001 |
| EP | 1 327 289 | 7/2003 |

(Continued)

OTHER PUBLICATIONS

F. Mogensen et al., "Locking Conditions and Stability Properties for a Semiconductor Laser with External Light Injection," IEEE Journal of Quantum Electronics, vol. QE-21, No. 7, Jul. 1, 1985, pp. 784-793.

(Continued)

*Primary Examiner*—Minsun Harvey
*Assistant Examiner*—Michael Carter
(74) *Attorney, Agent, or Firm*—DLA Piper LLP (US)

(57) ABSTRACT

An optical apparatus including a tunable master laser from which all or some of a beam is injected into at least one "slave" laser having a cavity with an amplifier medium and a dynamic holographic medium that forms a self-adapted spectral filter to maintain oscillation of the slave laser at a wavelength imposed by the master laser during injection after injection has stopped.

7 Claims, 3 Drawing Sheets

FOREIGN PATENT DOCUMENTS

| | | |
|---|---|---|
| WO | WO 00/25396 A1 | 5/2000 |
| WO | WO 02/31934 A2 | 4/2002 |
| WO | WO 02/31934 A3 | 4/2002 |

OTHER PUBLICATIONS

W.B. Whitten et al., "Mode selection in a continuous-wave dye laser with an intracavity photorefractive element," Optics Letters, vol. 12, No. 2, Feb. 1, 1987, pp. 117-119.

S.F. Lyuksyutov et al., "Pulsed dye laser with an intracavity nonlinear mirror a photorefractive crystal," Soviet Journal of Quantum Electronics, vol. 20, No. 3, Mar. 1, 1990, pp. 237-238.

S.F. Lyuksyutov et al., "Spectral equalization and autosweeping effects in a pulsed dye laser with an intracavity photorefractive element," Applied Optics, vol. 31, No. 9, Mar. 20, 1992, pp. 1217-1220.

N. Huot et al., "Laser mode manipulation by intracavity dynamic holography: Application to mode selection," Applied Physics B: Lasers and Optics, vol. B69, No. 2, Aug. 1999, pp. 155-157.

Gérald Roosen et al., "Adaptive shaping and filtering of laser beams using photorefractive elements," Conference on Lasers and Electro-Optics (CLEO 2001), Trends in Optics and Photonics, vol. 56, May 6, 2001, p. 341.

Antoine Godard et al., "Relaxation of the alignment tolerances of a 1.55-μm extended-cavity semiconductor laser by use of an intracavity photorefractive filter," Optics Letters, vol. 26, No. 24, Dec. 15, 2001, pp. 1955-1957.

Sébastien Maerten et al., "Laser diode made single-mode by a self-adaptive photorefractive filter," Optics Communications, vol. 208, No. 1-3, Jul. 1, 2002, pp. 183-189.

Gérald Roosen et al., "Self-organization of laser cavities using dynamic holograms," Optical Materials, vol. 23, No. 1-2, Jul. 2003, pp. 289-293.

* cited by examiner

TUNABLE LASER SOURCE WITH OPTICAL WAVELENGTH ADDRESSING

RELATED APPLICATION

This is a §371 of International Application No. PCT/FR2005/000906, with an international filing date of Apr. 14, 2005 (WO 2005/104310 A1, published Nov. 3, 2005), which is based on French Patent Application No. 04/03890, filed Apr. 14, 2004.

TECHNICAL FIELD

This disclosure relates to the optics field, particularly to a tunable laser source with optical wavelength addressing.

BACKGROUND

It is already known, as disclosed by EP 1 125 347, that there exist self-adapted filters for fine-tuning laser emissions. That disclosure relates to a laser-type light radiation source including a resonant cavity and an amplification medium placed in the resonant cavity, that source being characterized in that a dynamic photosensitive material is placed in the resonant cavity to form a spectral and/or spatial self-adapting filter.

It is also known, as disclosed in EP 1 327 289, that there exists a continuously wavelength tunable monomode laser source with an external cavity comprising:
  a resonant cavity having a reflective plane face, means for extracting a fraction of the light flux, and a retro-reflective dispersive device;
  at least one amplifier waveguide placed inside the resonant cavity; and
  means for controlling the retro-reflective dispersive device that provide continuous tunability therefore;
  that laser source being characterized in that it further comprises a photo-refractive component placed in the cavity, and that is sensitive to the wavelength of the laser source, in which component a Bragg grating is formed.

It is also known, as disclosed by EP 0 375 021, that there exists a tunable semiconductor diode laser with distributed reflection and a method of manufacturing such a semiconductor diode laser. That publication describes a tunable semiconductor diode laser with distributed reflection that comprises a semiconductor body in which a first radiation guide layer is superposed on a first passive layer in which a strip-shaped resonant cavity is formed between two surfaces extending substantially perpendicularly to the layers, in which resonant cavity there are juxtaposed a first section having a first current supply and an associated active region having a p-n junction that, at sufficiently high current, generates, in the forward direction, coherent electromagnetic radiation, the active region lying within the amplification profile of the radiation guide layer and being delimited laterally by a single layer having sides contiguous to other sections, a second section having a second current supply making it possible to vary the refractive index of a portion of the radiation guide layer that lies within the section, and a third section having a third current supply, the portion of the resonant cavity that lies within the third section having a periodic variation of the refractive index in the longitudinal direction, in which semiconductor diode laser the first radiation guide layer is situated over the entire length of the resonant cavity, the semiconductor diode laser being characterized in that it further comprises means whereby the relative intensity of that fraction of the radiation which is generated in the first section, and which is reflected at the junction between the first and second sections, is made small with respect to the intensity of the radiation returning from the second section to the junction.

The following publications are also known:
  K. Lui and M. G. Littman, "*Novel geometry for single-mode scanning of tunable lasers*", Opt. Lett. Vol. 6, pp. 117-118, 1981.
  F. Favre and D. Le Guen, "*82 nm of continuous tunability for an external cavity semiconductor laser*", Electron. Lett. Vol. 27, pp. 183-184, 1991.
  L. A. Coldren, "*Monolithic Tunable Diode Laser*", IEEE Journal on Selected Topics in Quantum Electron., vol. 6, pp. 988-999, 2000.
  N. Huot, J.-M. Jonathan, G. Paulit, P. Georges, A. Brun, G. Roosen, Appl. Phys. B 69, pp. 155, 1999.
  S. Maerten, N. Dubreuil, G. Pauliat, G. Roosen, D. Rytz, T. Salva, "*Laser diode made single-mode by self-adaptive photorefractive filter*", Optics Communications 208, pp. 183-189, 2002.
  S. F. Lyuksyutov and O. I. Yuschuck, "*Spectral equalization and autosweeping effects in a pulsed dye laser with an intracavity photorefractive element*", Applied Optics, vol. 31, pp. 1217-1220, 1992.
  F. Mogensen, H. Olesen and G. Jacobsen, IEEE J. Quantum Electron. QE-21, pp. 78, 1985;
  Petitbon, P. Gallion, G. Debarge, C. Chabran, IEEE J. Quantum Electron. QE-24, pp. 148, 1988.

There are three categories of controlling the spectra emitted by lasers and, more particularly, the spectra emitted by wavelength tunable lasers. The first category uses frequency filters that are said to be "static" (their frequency responses are fixed) and that are inserted into the cavity of the laser. The second category uses filters that are said to be "dynamic" their frequency responses are not invariable). Finally, the third category covers methods of optically injecting a coherent external beam (coming from another laser) into the cavity of the laser to be controlled.

For each of the categories, we list the technological limits of the methods described in the context of the following need: having N wavelength tunable laser sources (e.g. in the context of optical communications systems). The context is a use in which it is necessary to have a plurality of wavelength tunable laser sources that operate simultaneously and that can be reconfigured (programmed) independently of one another.

A first method of controlling the emission spectrum of a laser includes inserting frequency selective optical filters into the cavity of the laser. A first class of filters exists that are said to be "static", such as, for example, interference filters, diffraction gratings, Fabry-Perot etalons, etc. Once the filter is inserted into the cavity, it induces fixed loss differences between the modes of the laser, and can lead to laser emission in a single mode: the laser is then said to be "monomode" or "single-mode" (or "monochromatic"). The emission wavelength of the laser is the wavelength for which the filter induces minimized losses. It is possible to vary the wavelength by acting on the filter. When a diffraction grating is used, the emission wavelength is set by the angle of incidence of the beam on the grating. By varying the angle, a wavelength tunable source is obtained that has numerous uses. In the field of optical communications, such laser diode sources, of the extended cavity type, have continuous tunability over a range of 100 nm. Such sources, which are relatively costly, are widely used for characterizing passive and active optical components. They cannot be inserted into transmission links. However, for several years now, compact tunable laser diode sources have existed that are manufactured on the basis of integrating all of the necessary functionality features into the same chip. Such sources are laser diodes of the Distributed Bragg Reflector or "DBR" type, and they are increasingly used in optical transmission networks (to satisfy the needs of reconfiguring optical communications networks).

The limits of such a method are not so much technological as economic. Whenever an application requires a large number of tunable sources, the problem of cost inevitably arises. Unfortunately, such tunable sources are technologically highly advanced, costly to manufacture and to characterize. In addition, for DBR-type diodes, wavelength tuning is performed by acting on three different parameters (which correspond to three currents to be injected into three different sections of the diode). Full characterization of the diode is necessary to determine the triplet of currents to be applied to cause the diode to operate at the desired wavelength. Those operating points are stored in an electronic card. This explains their relatively high utilization cost and management of operation in parallel of N sources that is somewhat complicated (the operating points of all N sources must be characterized and stored in a memory).

Research has been conducted on laser cavities into which "dynamic" filters are inserted. Unlike static filters, their frequency responses are not fixed and adapt to the modes structure of the laser. Such a filter has a dynamic holographic medium in which the modes structure of the laser records a hologram which then acts on the losses of those modes. Those losses are different for the various modes, and they lead, after a competition phenomenon, to a reduction in their number. The hologram adapts continuously to the new modes structure so that, in some cases, it selects only one mode. Inserting a photorefractive crystal (which acts as a dynamic holographic medium) leads to a reduction by a factor of 300 in the width of the spectrum of a Ti laser: sapphire operating under pulsed conditions, and to operation under monomode conditions of an Nd continuous laser: $YVO_{4-}$. Such lasers oscillate initially, without any holographic medium, under multimode conditions. It should be noted that, in the particular case of the Nd laser: $YVO_4$, the cavity does not include any frequency selective element, other than the hologram that is written in the photorefractive crystal. Identical results have been obtained in an extended-cavity laser diode source. The dynamic nature of the filter enables it to adapt to the operating point of the laser. In the event of a change of operating point of the laser, the filter adapts to the new modes structure and keeps a monomode oscillation. However, without the use of any other static filter, it is impossible, a priori, to predict the wavelength at which the laser will oscillate after the hologram has been written. The only predictable event is that the spectrum of the laser, which is initially multimode, is rendered monomode after the holographic medium is inserted into the cavity.

By combining a static filter and a dynamic filter in the cavity, it is, however, possible to set the operating wavelength of the laser as shown in S. F. Lyuksyutov and O. I. Yuschuk, "*Spectral equalization and autosweeping effects in a pulsed dye laser with an intracavity photo-refractive element*", Applied Optics, vol. 31, pp. 1217-1220, 1992. In a first stage, the laser operates in the presence of the grating and of the crystal in which a hologram is recorded. It then oscillates simultaneously at a plurality of wavelengths. Then, by causing the laser to operate with the crystal alone in the cavity, the laser continues to oscillate at the same wavelengths for a short time of a few minutes. After a few minutes, the oscillation wavelength changes.

When the cavity has no frequency selective element other than a dynamic holographic filter, comprising, for example, a photorefractive crystal, the limit of that type of cavity comes from the fact that the wavelength at which the laser oscillates cannot, a priori, be predicted.

Another method is well known, that method being a method of controlling the spectrum of a laser and being constituted by optical injection. It provides a "master" laser whose beam is injected into a "slave" laser. Under certain conditions, related to the power of the beam coming from the master laser and to the mismatch between the oscillation frequency of the master laser and the frequency of one of the resonant modes in the cavity of the slave laser, the slave laser can then oscillate at a wavelength that is similar to or even identical to the wavelength of the master laser.

These properties are kept so long as the injection of the beam coming from the master laser is effective. As soon as the beam disappears, the slave laser resumes its initial operating conditions.

If a wavelength tunable master laser is provided in this case, it is possible to have one or more tunable slave lasers. However, all of the slave lasers operate at the same wavelength (set by the wavelength of the master laser). It is impossible to configure one of the slave lasers independently from the others. All of the slave lasers are dependent on one another.

It would therefore be advantageous to store the operating wavelength (state) of the injected slave laser in a memory after the control (injection) beam coming from the master laser has been interrupted.

SUMMARY

An optical apparatus including a tunable master laser from which all or some of a beam is injected into at least one slave laser having a cavity with an amplifier medium and a dynamic holographic medium that forms a self-adapted spectral filter to maintain oscillation of the slave laser at a wavelength imposed by the master laser during injection after injection has stopped is disclosed.

Test equipment including a plurality of light sources forming a comb of wavelengths, wherein each of the light sources includes a tunable master laser and a plurality of slave lasers, each of which includes a dynamic holographic medium is also disclosed.

An optical addressing source for forming a comb of wavelengths including one tunable master laser and a plurality of slave lasers, each of which includes a dynamic holographic medium is further disclosed.

BRIEF DESCRIPTION OF THE DRAWINGS

The description will be better understood on reading the following text given merely by way of explanation and with reference to the accompanying figures, in which.

DETAILED DESCRIPTION

Figure 1:
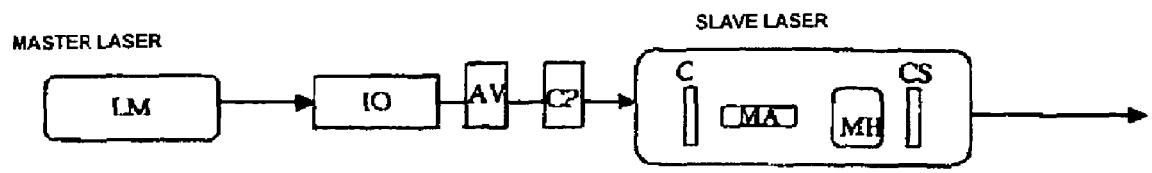
FIG. 1 shows a slave laser containing a dynamic holographic medium (MH) subjected to optical injection of a beam coming from a master laser (LM)

Since the slave laser incorporating a holographic medium is capable of conserving the programmed wavelength after the injection beam has been interrupted, the master laser is available for programming a second slave laser. The second slave laser can be programmed at a wavelength that is different from the wavelength of the first programmed laser when a wavelength tunable (programmable) master laser is available. Thus, a single wavelength tunable master laser can optically address (program) a plurality (the number is a priori not limited) of slave lasers incorporating holographic media, and can do so at wavelengths that are different and reprogrammable for each laser.

To this end, we provide apparatus for emitting at least one tunable monomode laser beam, the apparatus comprising a tunable master laser exciting at least one slave laser, the apparatus being characterized in that the cavity of the slave laser includes a dynamic holographic medium.

More precisely, we provide optical apparatus comprising a tunable "master" laser from which all or some of the beam is injected into at least one "slave" laser, the optical apparatus being characterized in that the cavity of the slave laser, in addition to having an amplifier medium, has a dynamic holographic medium that forms a self-adapted spectral filter.

The dynamic holographic medium makes it possible to maintain the oscillation of the slave laser at the wavelength imposed by the master laser during the injection after the injection has stopped.

Preferably, the apparatus has a plurality of slave lasers, each of which includes a dynamic holographic medium. Advantageously, the cavity includes a broadband filter for compensating for gain curvature.

The dynamic holographic medium may be positioned inside the cavity close to the output coupler. Also, the dynamic holographic medium may be a photorefractive crystal. The injection of the beam coming from the master laser may be performed via the output face of the slave laser, via an optical circulator.

We also provide test equipment for testing optronic components and including a plurality of light sources, the test equipment being characterized in that each of the sources comprises a tunable master laser and a plurality of slave lasers, each of which includes a dynamic holographic medium.

We further provide an optical addressing source for forming a comb of wavelengths, the optical addressing source being characterized in that it comprises one tunable master laser and a plurality of slave lasers, each of which includes a dynamic holographic medium.

We associate the techniques based on optical injection and inserting a dynamic holographic medium into the laser cavity. The optical injection forces the laser to oscillate at a desired and variable wavelength. The holographic medium enables the laser to maintain the oscillation at that same wavelength in the absence of the injector. Thus, the limits given above for each of the two techniques are overcome.

Our techniques are particularly advantageous in an application in which it is necessary to have a plurality of tunable laser sources. A first solution includes having N identical tunable sources based on a static-filter-in-cavity technology. The source can, where necessary, be compact (integrated technology). As mentioned above, such sources are high-performance, but costly. The cost of a source is to be multiplied by the number of sources. In addition, such sources are complex and difficult to operate. The N sources are based on a simpler technology and are above all controlled by a single master source which is a tunable source. The cost of the master source is distributed over the entire set of slave lasers. The technological effort is also shared. As current knowledge stands, slave lasers are much less complicated to operate and to characterize. They should represent a lower cost.

We enable, in particular, the wavelength of the laser to be programmed or optically addressed.

This addressing can take place remotely. In the absolute, the master laser can be remote from the slave laser to be controlled. About one hundred $\mu W$ (about $-10$ dBm) of power in the beam coming from the master laser suffices to disturb the slave laser and enable the slave laser to store the wavelength addressed by the master laser. Practically, it is possible to imagine having a master laser in an exchange that is remote from the node by several tens of kilometers and that remotely and optically controls the wavelength of the laser placed at the node. If the decision is taken at the exchange to change the wavelength allotted to the node, the decision is transmitted to the master laser (i.e. locally) which then acts remotely on the slave laser. The command is transmitted optically and the nature of the command signal is simple: a beam coming from the master laser and whose coherence must be transferred to the remote slave laser. When tunable diodes are used at the nodes, the command must be an electrical command.

Figure 3:
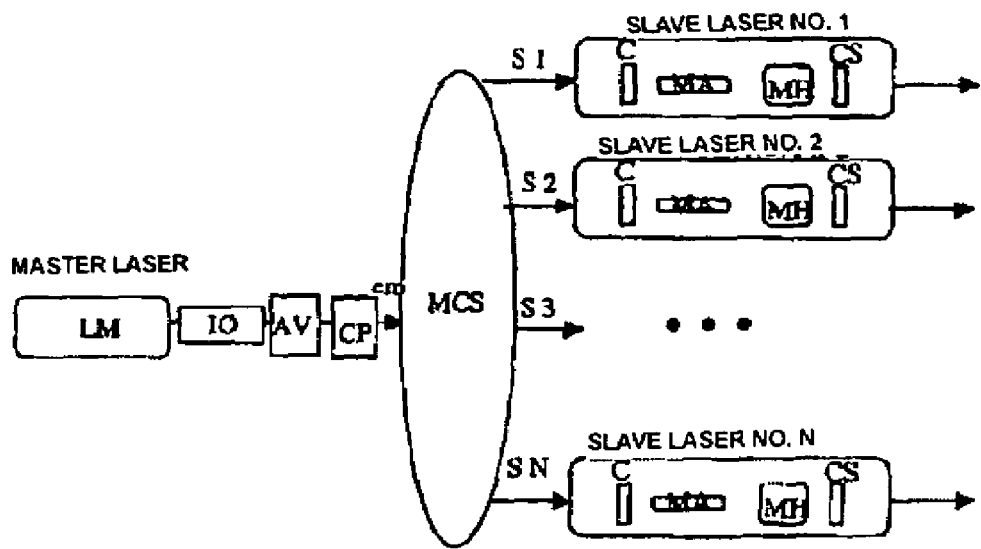
FIG. 3 shows a matrix of slave lasers, each of which includes a dynamic holographic medium (MH) and whose wavelength is set by optically injecting the beam coming from the master laser through a space-division switching matrix or "SDSM" (MCS) which selects the slave laser(s) to be programmed.
Figure 4:
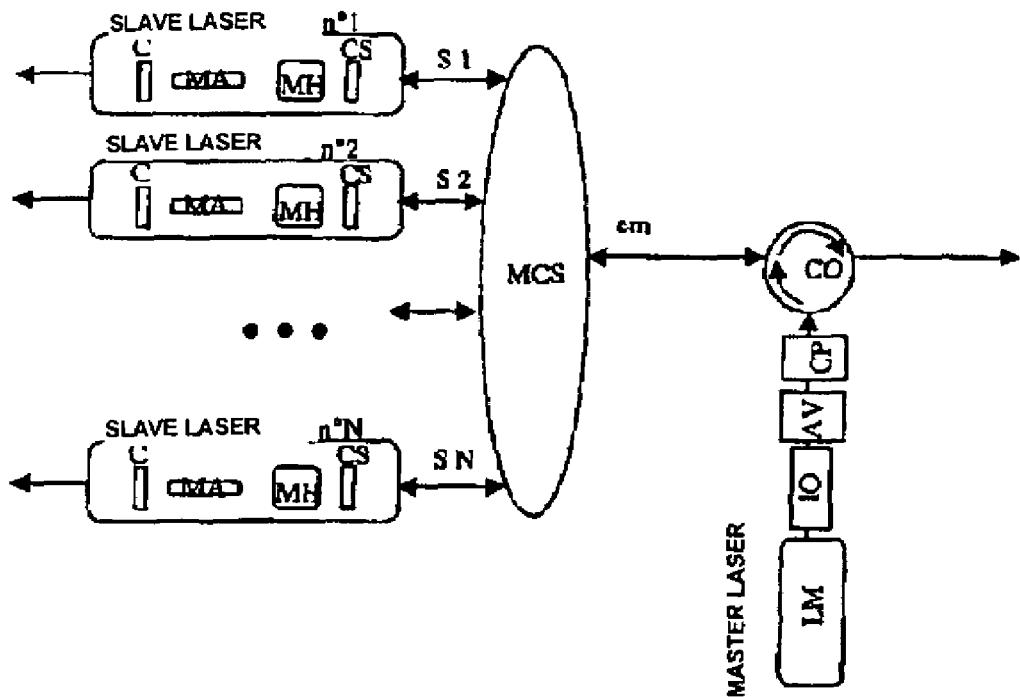
FIG. 4 diagrammatically shows another aspect.

The essential argument is illustrated by FIGS. 3 and 4 which show possible architecture variations for a master laser that performs wavelength control on a matrix of N slave lasers. The advantage of this architecture is that the N slave lasers share a single tunable source. It can be imagined that that source is costly to manufacture and that the N slave lasers can be identical and based on a less costly technology (it is not necessary to use "all-integrated" technology). Naturally, the cost argument is merely speculative and needs to be substantiated, but it appears realistic. The technological effort is put on the master laser (tunable laser diode source, DBR laser diode, etc.) which must, in particular, be wavelength calibrated (qualified). This justifies the high cost of this type of source. For "slave" lasers, it is a priori unnecessary for them to be wavelength calibrated, unlike DBR laser diodes currently in use in the nodes of optical telecommunications networks.

Regarding cost, a solution for networks close to the subscriber and in which passband allocation must necessarily be more flexible to adapt to accommodate the variable flux. In addition, such slave lasers adapt easily to accommodate the optical granularity (in terms of carrier density) of the network. It is equally possible to cause the same laser to operate in a Dense Wavelength Division Multiplexing (DWDM) or Wavelength Division Multiplexing (WDM) network with differences between wavelengths of 0.4 nm, 0.8 nm, or 1.6 nm, or indeed even greater differences.

We provide a "slave" laser whose cavity incorporates a dynamic holographic medium and whose wavelength is set by optical injection into its cavity of a beam coming from a "master" second laser. Under injection conditions, the mode structure that oscillates in the cavity of the slave laser records a hologram in the dynamic holographic medium. The hologram reduces the losses of the mode(s) that oscillate(s) in the cavity of the slave laser, and therefore reinforces operation thereof. After the beam coming from the master laser has been interrupted, the hologram is sustained by the mode that oscillates and, in return, guarantees oscillation on this single mode: the slave laser thus conserves the wavelength imposed by the master laser. Thus, the wavelength of the slave laser is set by optically injecting a beam coming from a master laser and is stored in a memory by the slave laser after the beam coming from the master laser has been extinguished.

The slave laser shown in FIG. 1 is made up of an amplifier medium (MA) and of a (linear) cavity formed by at least two mirrors (C and CS) inside which a dynamic holographic medium (MH) is inserted. The beam coming from the master laser (LM) is injected into the cavity of the slave laser, either directly or after having passed through an optical isolator (IO) that protects the master laser from external parasitic lighting, through a variable attenuator (VA) that makes it possible to adjust the power of the beam coming from the master laser and to be injected into the slave laser, and through a polarization controller (CP) that makes it possible cause the polarization state of the beam coming from the master laser to coincide with the polarization state of the beam coming from the slave laser. The components referenced IO, AV, and CP are optional. The optical links that are shown between the various elements (black arrows) are implemented either through empty space or through optical waveguides (e.g. optical fibers).

Other arrangements are possible between the master laser and the slave laser that includes a dynamic holographic medium, with a view to injecting all or some of the beam coming from the master laser into the cavity of the slave laser. Examples are described below.

Figure 2:
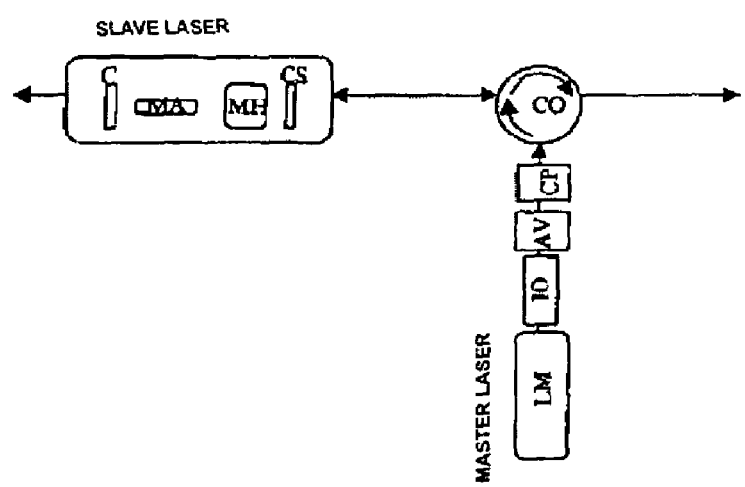
FIG. 2 shows another aspect that differs from FIG. 1 by use of an optical circulator (CO)

FIG. 2 shows injecting the beam coming from the master laser into the cavity of the slave laser through an optical circulator CO. The beam coming from the master laser penetrates into the optical circulator CO, and it is then directed directly into the cavity of the slave laser (incident on the mirror CS). The laser beam generated by the slave laser can exit through the coupler C or indeed through the output coupler CS. The beam emitted through the coupler CS is incident on the optical circulator CO and is directed outwards and not towards the master laser. The use of the optical circulator CO is advantageous when the coupler C of the slave laser is a highly reflective mirror. In addition, the optical circulator CO isolates the master laser from the light radiation emitted by the slave laser and makes it possible to omit the optical isolator IO.

Since the beam coming from the master laser is optically injected only temporarily (for the time necessary for the hologram to be written), the beam can then be used for injecting another slave laser. Thus, the cavity shape that is proposed for the slave laser offers the possibility of controlling a series of slave lasers using a single master laser. It is necessary merely to displace the beam coming from the master laser to the slave laser to be controlled. This use of a single master laser for controlling N slave lasers is highly advantageous whenever the master laser is wavelength-tunable. Each slave laser is then programmable (addressable) at a different wavelength. The addressing is optical and reconfigurable. To change the operating wavelength of a slave laser, it is necessary merely to re-iterate the injection process after having tuned the master laser to a new wavelength. Thus, it is possible to obtain a matrix of lasers having reconfigurable optical wavelength addressing.

The configuration of this aspect is shown in FIG. 3, in which N (N>1) lasers are disposed that are identical to the slave laser of FIG. 1 and that are connected to the master laser via a space-division switching matrix. The sole purpose of this matrix is to select an optical path for connecting the beam (em) coming from the master laser to one or more slave lasers which are connected to respective ones of the various outputs S1, S2, . . . SN of the space-division switching matrix MCS.

FIG. 4 describes a configuration for programming a matrix of slave lasers that is similar to FIG. 2, except that the optical circulator CO is inserted between the master laser and the space-division switching matrix (MCS).

EXAMPLE

Figure 5:
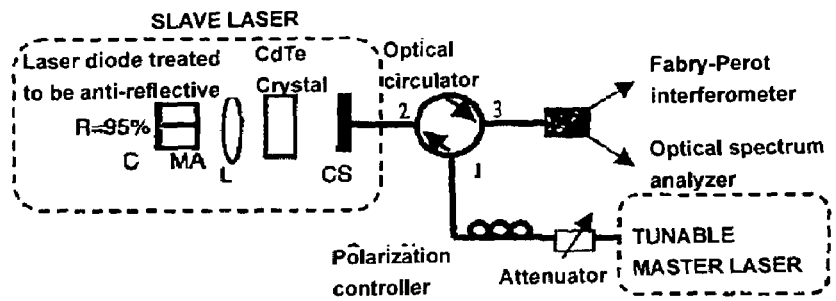
FIG. 5 diagrammatically shows an optical injection circuit.

FIG. 5 shows an experimental demonstration. The slave laser was constituted of an amplifier medium MA (semiconductor diode), one face C of which had received high-reflection treatment and the other face of which had received anti-reflection treatment. The beam coming from the anti-reflection face was made parallel by the collimation lens L. The slave cavity was closed by the output coupler CS (semi-reflective mirror). A CdTe photorefractive crystal was used as a dynamic holographic medium. It was inserted into the cavity between CS and L. It was cut such that the two counter-propagating beams of the cavity wrote a hologram therein by reflection. The hologram and the output coupler CS constituted a spectral filter (reflection Fabry-Perot interferometer) that automatically adapted to the mode that oscillated. If the crystal was positioned in the right direction, the spectral filter had minimum losses for the wavelength of the mode that wrote it, which mode was the mode that oscillated.

The master laser was a monomode laser diode that was tunable from 1480 nm to 1600 nm. The entire circuit was fibered. The output of the master laser was connected to the output of the cavity of the slave laser via an optical circulator. A variable attenuator and a polarization controller were disposed at the output of the master laser. The spectral properties of the slave laser were analyzed by means of the above-mentioned Fabry-Perot interferometer and of the above-mentioned optical spectrum analyzer. These instruments were connected to a 50/50 coupler which was itself connected to the output 3 of the circulator.

By means of this circuit, the effect of the wavelength being stored in a memory by the slave laser after optical injection of the beam coming from the master laser was verified.

In the field of optical telecommunications, laser sources generate optical carriers whose wavelength positions are standardized and spaced apart at 0.8 m or 0.4 m. The carriers must be distributed over a periodic grid defined by the ITU standard.

Figure 6:
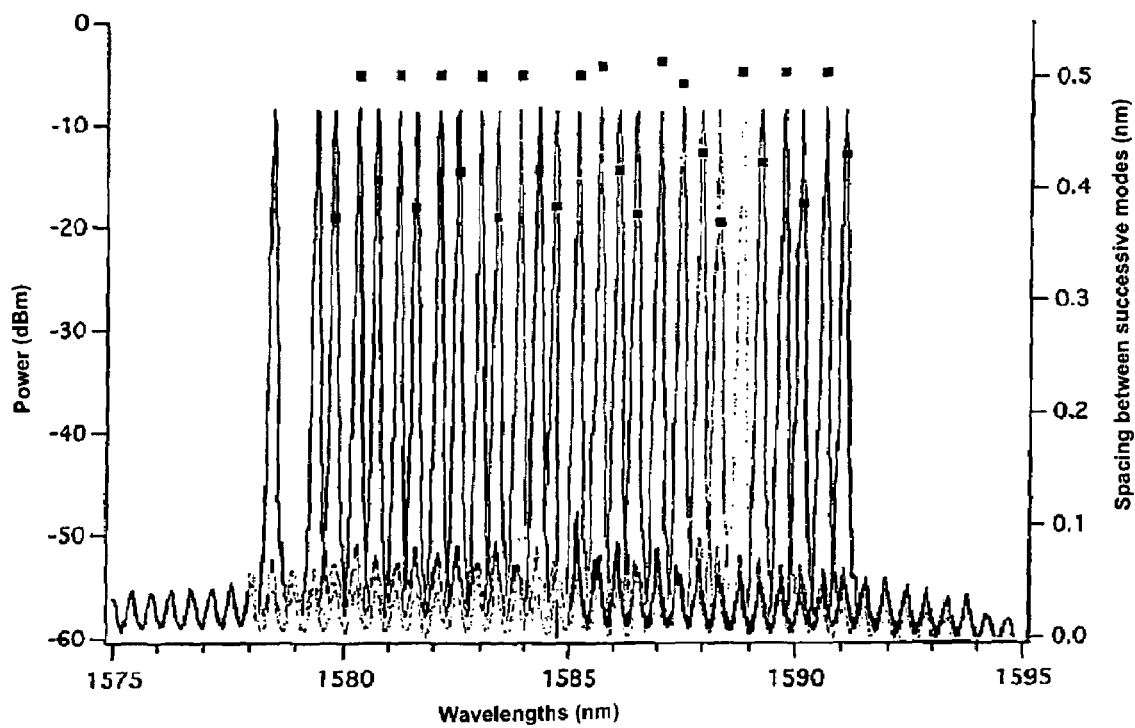
FIG. 6 shows the optical spectra of the slave laser as programmed by the master laser by optical injection using an almost-periodic comb of wavelengths.

The slave laser was tuned by means of the master laser, using a pseudo ITU grid. The slave laser initially oscillated at 1584.671 nm. The master laser was successively tuned using a grid of wavelengths lying in the range 1578.493 nm to 1591.541 nm, with spacing between the values lying in the range 0.4 nm to 0.5 nm. For each wavelength, the beam coming from the master laser was injected into the slave laser (the slave laser previously oscillating 1584.671 nm). The wavelength of the master laser was then finely adjusted so that it was clearly observed that the wavelength of the slave laser was displaced towards the wavelength of the master. The beam coming from the master was then interrupted, and the wavelength of the slave laser was measured roughly using the optical spectrum analyzer (precision ±0.001 nm). The successive spectra measured at the output of the slave laser, after injection from the master laser, are grouped together in the same graph in FIG. 6. It was thus possible to program operation of said lave laser diode source over 27 different wavelengths around 1584 nm. The difference in wavelength between two successive carriers is represented by squares. Admittedly, the comb is not very periodic (it is possible to achieve a periodic comb). But the difference between the carriers remained in the range 0.4 nm to 0.5 nm. With the same configuration, it would have been possible to program a comb with spacing of 0.8 nm, or even 1.6 nm.

Thus, we provide a "slave" laser (and to a set of slave lasers) in which the cavity incorporates a dynamic holographic medium and whose wavelength is set by optically injecting a beam coming from a second laser, or "master" laser, into its cavity. Under injection conditions, the slave laser oscillates on a mode whose wavelength is close to or even identical to the wave-length of the master laser. It then records a hologram in the dynamic holographic medium. The hologram acts as a spectral filter whose loss minimum corresponds to the mode that the hologram has recorded, i.e., to the mode that oscillates. The mode that oscillates is thus stabilized by the hologram. After interrupting the beam coming from the master laser, the losses induced by the hologram maintain the mode above the oscillation threshold and maintain the other modes below the threshold: only the mode selected by the injection oscillates. In return, oscillation of the mode continuously rewrites the hologram which cannot thus fade away. The oscillation on the mode and, thus, the selected wavelength is, thus, self-sustained after the master laser is extinguished. This does not apply in more conventional experiments of injecting from a master laser to a slave laser that does not have a holographic medium, the disturbance of the operation of the slave laser then being effective only for the time during which the injection is taking place.

As soon as it is no longer subjected to the injection of the beam coming from the master laser, the slave laser resumes its characteristic oscillation conditions and does not keep its injection-conditions operating state.

Although this disclosure has been described in connection with specific forms thereof, it will be appreciated that a wide variety of equivalents may be substituted for the specified elements described herein without departing from the spirit and scope of this disclosure as described in the appended claims.

The invention claimed is:

1. An optical apparatus comprising a tunable master laser from which all or some of a beam is injected into at least one "slave" laser having a cavity with an amplifier medium, and a dynamic holographic medium that forms a self-adapted spectral filter to maintain oscillation of the slave laser at a wavelength imposed by the master laser during injection after injection has stopped.

2. The apparatus according to claim 1, comprising a plurality of slave lasers, each of which includes a dynamic holographic medium.

3. The apparatus according to claim 1, wherein the cavity of the slave laser includes a fixed spectral filter whose spectral response compensates for gain curvature of a gain medium of the amplifier medium.

4. The apparatus according to claim 1, wherein the dynamic holographic medium is positioned inside the cavity close to the output coupler.

5. The apparatus according to claim 1, wherein the dynamic holographic medium is a photorefractive crystal.

6. The apparatus according to claim 1, wherein the injection of the beam coming from the master laser is perfomed via an output face of the slave laser, via a component making it possible to connect the master laser to one or more slave lasers temporarily or permanently.

7. The apparatus according to claim 6, wherein the component is an optical circulator.

* * * * *